United States Patent
Chung

(10) Patent No.: US 8,466,008 B2
(45) Date of Patent: Jun. 18, 2013

(54) STACKED SEMICONDUCTOR PACKAGE AND STACKING METHOD THEREOF

(75) Inventor: Tae Seung Chung, San Jose, CA (US)

(73) Assignee: Polystak, Inc., San Jose, CA (US)

( * ) Notice: Subject to any disclaimer, the term of this patent is extended or adjusted under 35 U.S.C. 154(b) by 0 days.

(21) Appl. No.: 13/571,262

(22) Filed: Aug. 9, 2012

(65) Prior Publication Data
US 2012/0322201 A1 Dec. 20, 2012

Related U.S. Application Data

(62) Division of application No. 12/954,489, filed on Nov. 24, 2010, now Pat. No. 8,310,041.

(30) Foreign Application Priority Data
Aug. 12, 2010 (KR) .................. 10-2010-0077986

(51) Int. Cl.
  *H01L 21/44* (2006.01)
(52) U.S. Cl.
  USPC .................................. 438/109; 257/E21.614
(58) Field of Classification Search
  USPC ...................... 438/107, 109; 257/E21.614
  See application file for complete search history.

(56) References Cited

U.S. PATENT DOCUMENTS

| 6,242,285 B1 | 6/2001 | Kang |
| 6,542,393 B1 * | 4/2003 | Chu et al. .................. 365/51 |
| 2007/0290312 A1 | 12/2007 | Partridge |
| 2007/0290313 A1 | 12/2007 | Partridge |

FOREIGN PATENT DOCUMENTS

KR   10-2001-0086476   9/2001

* cited by examiner

*Primary Examiner* — Quoc Hoang
(74) *Attorney, Agent, or Firm* — NSIP Law

(57) ABSTRACT

A stacked semiconductor package technique applicable to semiconductor chips having pins short enough that the semiconductor chips cannot be directly bonded together is provided. A printed circuit board (PCB) is inserted into a space between pins of an upper semiconductor chip and the exterior of bodies of stacked semiconductor chips. The PCB includes a plurality of conductive patterns at locations corresponding to the respective pins. The respective conductive patterns and the corresponding respective pins of the upper and lower semiconductor chips are bonded together. The PCB includes a plurality of recess patterns on one side, the recess patterns having the same pitch as the pins of the semiconductor chips. The PCB is disposed across the pins of the lower semiconductor chip, and thereby easily arranged with the stacked semiconductor chips.

3 Claims, 6 Drawing Sheets

US 8,466,008 B2

STACKED SEMICONDUCTOR PACKAGE AND STACKING METHOD THEREOF

CROSS-REFERENCE TO RELATED APPLICATION(S)

This application is a division of U.S. patent application Ser. No. 12/954,489, filed on Nov. 24, 2010, now U.S. Pat. No. 8,310,041 which claims the benefit under 35 U.S.C. §119(a) of Korean Patent Application No. 10-2010-0077986, filed on Aug. 12, 2010, the entire disclosure of which is incorporated herein by reference for all purposes.

BACKGROUND

1. Field

The following description relates to a stacked semiconductor package technique for stacking semiconductor chips on a chip basis.

2. Description of the Related Art

A new stacked semiconductor package technique that doubles memory capacity by, for example, stacking two identical memory semiconductor packages has been introduced. U.S. Pat. No. 6,242,285 discloses a method that has been implemented by an applicant of the present invention. The above prior art is advantageous in its implementation since pins on an upper chip are deformed and subsequently are directly bonded with pins on a lower chip.

However, some pins have been recently designed to have shorter lengths, so that ends of pins on an upper chip come to be relatively far apart from upper ends of pins on a lower chip. Consequently, after a soldering paste process, bonding is performed improperly, resulting in the occurrence of more defects.

SUMMARY

The following description relates to a technique for effectively stacking chips having shorter pins. A complex technique for easily and effectively connecting pins spaced apart from each other by a distance that makes the pins impossible to be directly bonded together is provided.

In one general aspect, provided is a stacked semiconductor package including: a first semiconductor chip configured to comprise a plurality of first pins on at least one side for connection with an external circuit; a second semiconductor chip configured to be stacked above the first semiconductor chip and comprise a plurality of second pins on at least one side corresponding to the first pins, the second pins having ends that extend toward and are spaced apart from upper portions of the corresponding first pins; a printed circuit board (PCB) configured to be disposed in a space between the second pins and chip bodies of the first and second semiconductor chips and along a length of the first and second semiconductor chips and comprise a plurality of conductive patterns, each extending from the end of the corresponding is second pin toward the upper portion of the corresponding first pin; and a plurality of bonding portions, each configured to electrically connect a conductive pattern of the PCB, an end of a corresponding second pin and an upper portion of a corresponding first pin.

The PCB may be further configured to comprise a plurality of recess patterns on one side, each recess pattern having the same pitch as the first pin. The PCB may be arranged in alignment with the first and second semiconductor chips by the recess patterns in contact with the upper portions of the corresponding first pins.

Other features and aspects will be apparent from the following detailed description, the drawings, and the claims.

Figure 1A:
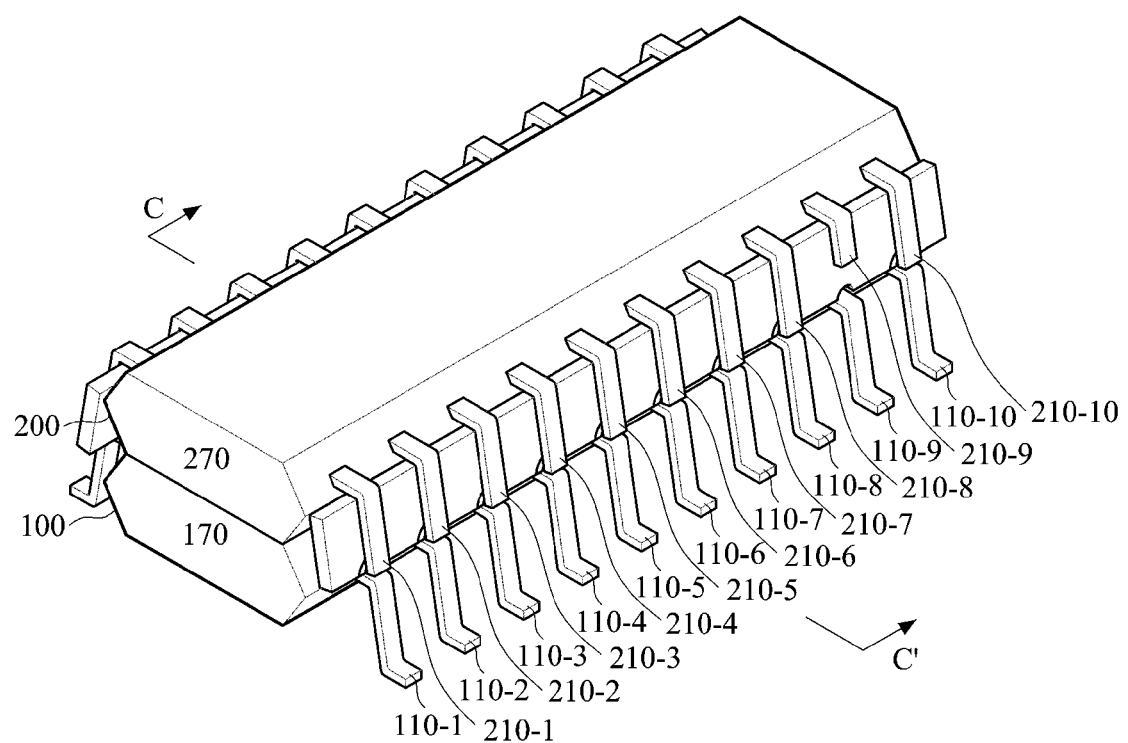
FIG. 1A is a side view illustrating an example of an exterior of a printed circuit board (PCB).

Throughout the drawings and the detailed description, unless otherwise described, the is same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1B:
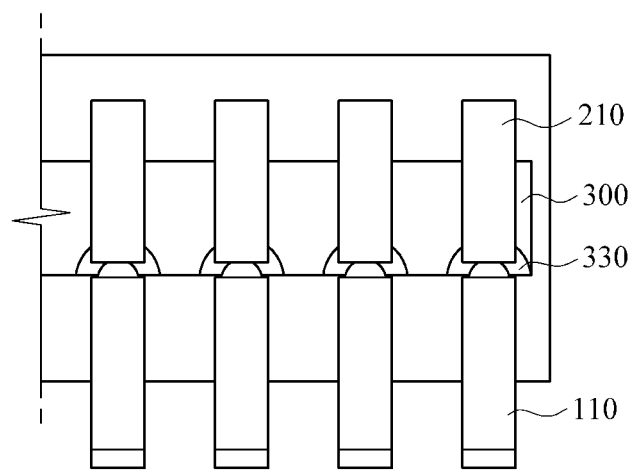
FIG. 1B illustrates a cross-sectional view taken along a line C-C' in the example illustrated in FIG. 1A.
Figure 1C:
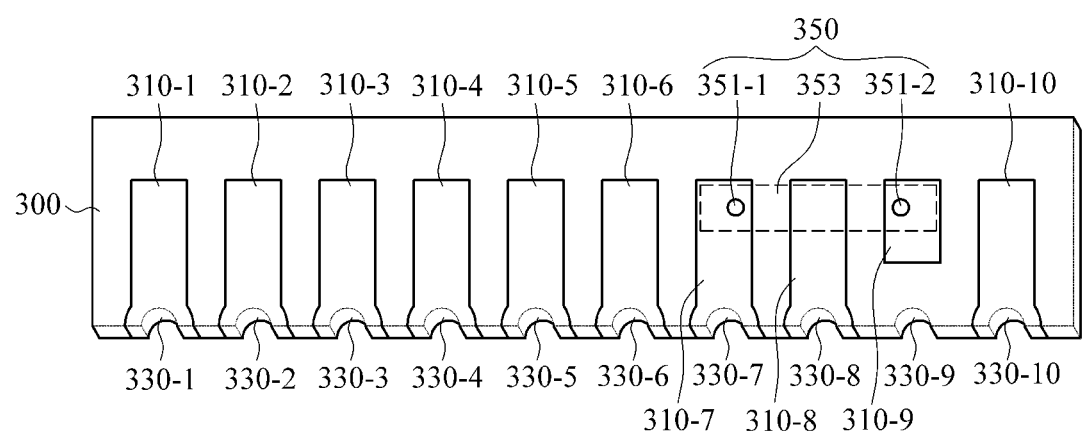
FIG. 1C is an enlarged view illustrating an example of the stacked semiconductor package shown in the example illustrated in FIG. 1A.
Figure 1D:
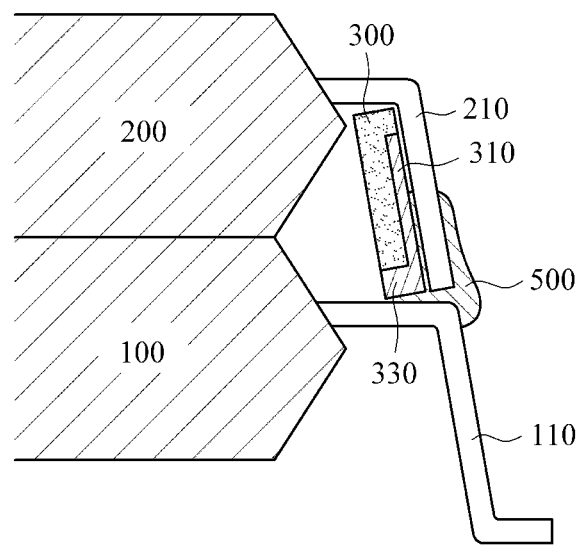
FIG. 1D is an enlarged cross-sectional view illustrating an example of a recess pattern and a first pin and a second pin being bonded together.

FIG. 1A is a side view illustrating an example of an exterior of a printed circuit board (PCB) and its pins before a stacked semiconductor package passes through soldering paste. FIG. 1B is a cross-sectional view taken along a line C-C' in the example illustrated in FIG. 1A. FIG. 1C is an enlarged view illustrating an example of the stacked semiconductor package shown in the example illustrated in FIG. 1A. FIG. 1D is an enlarged cross-sectional view illustrating an example of a recess pattern and a first pin and a second pin being bonded together.

As shown in FIGS. 1A to 1D, the stacked semiconductor package may include a first semiconductor chip 100 and a second semiconductor chip 200 which is stacked on the first semiconductor chip 100. The first semiconductor chip 100 may include a plurality of first pins 110-1, . . . , and 110-10 on a side for connection to an external circuit. The second semiconductor chip 200 may include a plurality of second pins 210-1, . . . , and 210-2 on a side. As shown in the example illustrated in FIG. 1B, ends of the second pins 210 are spaced apart from corresponding upper portions of the first pins 110 and extend upward.

In a space between the second pins 210 and chip bodies 170 and 270, the PCB 300 is is disposed above the first pins 110 along a length of the first and second chips 100 and 200. The PCB 300 may include a plurality of conductive patterns 310-1, . . . , and 310-10 that correspond to the first and second pins. The conductive patterns 310-1 to 310-8 and 310-10, excluding a conductive pattern 310-9 that is formed to be shorter than the rest, are designed to extend from the ends of the corresponding second pins 210 to the upper portions of the first pins 110. The conductive patterns 310-1 to 310-8 and 310-10 are electrically connected to the ends of the corresponding second pins 210-1 to 210-8 and 210-9 and the upper portions of the corresponding first pins 110-1 to 110-8 and 110-10 by a bonding portion 500.

As shown in FIGS. 1A to 1D, similar to the prior art, in the stacked semiconductor package, the ends of the second pins 210 are deformed to extend toward the upper portions of the first pins 110. However, the present invention is not limited to the above, and may include a semiconductor chip having pins originally extending downward. Unlike the prior art, the ends of the second pins 210 are not long enough to reach the upper portions of the first pins 110. Soldering in accordance with the prior art cannot provide reliable electrical connection between the ends of the second pins 210 and the upper portions of the first pins 110. The conductive patterns 310 formed on the PCB offer an extending plane that allows soldering paste to be stably connected between the end of the second pins 210 and the upper portions of the first pins 110. In the example, the bonding portion 500 may be formed by soldering the first and second pins 110 and 210 and the conductive patterns 310. In the course of passing through soldering paste solution, soldering solution is adhered to cover the upper portions of the first pins 110, passing through the conductive patterns 310 from the ends of the second pins 210, and thereby providing stable electrical connection between the first and second pins 110 and 210.

Although U.S. Pat. No. 6,242,285 discloses a method of connecting pins using an auxiliary unit similar to a PCB, the PCB of the prior art only provides a path for bridging is between a control pin on an upper chip and a no-connection (NC) pin on a lower chip. A configuration for bridging is not particularly disclosed in the prior art. According to the above prior art, the pins on the upper and lower chips are directly connected primarily by soldering.

In the examples illustrated in FIGS. 1A to 1D, the PCB 300 may be a flexible PCB (FPCB), or may be any other type of PCB. In another example, the PCB 300 may include a plurality of recess patterns 330 having the same pitch as the first pins 110 on a side. The recess patterns 330 are in contact with the upper portions of the respective first pins 110, and thus the PCB 300 can be aligned with the first and second pins 110 and 210 of the respective first and second semiconductor chips 100 and 200.

In the example, each of the recess patterns 330 may be formed by cutting a conductive through hole along a length direction, wherein the conductive through hole is in conduction with the conductive pattern 310. In this case, since a recess on a cut portion of each recess pattern 330 has a conductive pattern formed thereon, as shown in the example illustrated in FIG. 1D, the soldering paste permeates deep into the recess, thereby fastening the connection with the pins 110 and 210. However, the recess patterns 330 may not be limited to the above, and may be simple patterns without conductive pattern formed thereon.

In another example, the PCB 330 may further include a bridge pattern 350 having one end connected to a control pin 210-9 of the second semiconductor chip and the other end connected to an NC pin 110-9 of the first semiconductor chip. The bridge pattern 350 may be formed on an inner layer so as to be disconnected from the conductive patterns 310-7 to 310-9. That is, in this case, the PCB is a multi-layer FPCB.

The illustrated examples are disclosed under the assumption that two identical DRAM packages are stacked to double the capacity of memory as an example. However, the described is examples are only exemplary, and are not intended to limit the scope of the present invention. In the examples, most pins such as address pins and data pins on the respective upper and lower chips are connected to the respective corresponding pins. To double the capacity, addresses have to be substantially extended by use of a chip select (CS) pin 210-9 which distinguishes the chips from each other during read and write operations. To this end, an NC pin 110-7 on the first semiconductor chip 110 which is a lower chip is used. To connect the CS pin 210-9 to the NC pin 110-7, the bridge pattern is provided.

As shown in the example illustrated in FIG. 1C, the bridge pattern 350 may include one end connected to the short conductive pattern 310-9 via a through hole 351-2 and the other end connected to one 330-7 of conductive patterns via a through hole 351-1, and be configured as an inner pattern 353 formed on the inner layer of a multi-layer. In this case, the short conductive pattern 310-9 is formed on an upper surface of the PCB 300 to have a length short enough to be bonded to only one 210-9 of the second pins. The conductive pattern 310-9 is formed to be short enough, and the second pin 210-9 which is bonded to the short conductive pattern 310-9 is cut substantially short. Hence, in the course of passing through soldering paste solution, the soldering solution covers the first pin 110-9 corresponding to the second pin 210-9, and consequently direct electrical connection between the first pin 110-9 and the second pin 210-9 can be avoided. Accordingly, the CS pin 210-9 on the second semiconductor chip 200 is allowed to be electrically connected to the NC pin 110-7 on the first semiconductor chip 100, so that the second semiconductor chip 200 can be directly controlled through the NC pin 110-7 on the first semiconductor chip 100 when the first pins on the first semiconductor chip 100 are connected to an external mount board.

Figure 2:
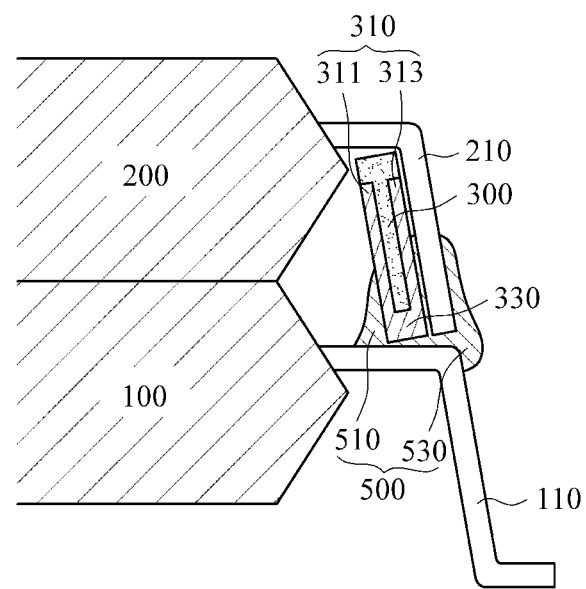
FIG. 2 is an enlarged view illustrating another example of a recess pattern of a PCB and first and second pins being bonded together.

FIG. 2 is an enlarged view illustrating another example of a recess pattern of a PCB and first and second pins being bonded together. The same elements as those shown in the is examples illustrated in FIGS. 1A to 1D have the same reference numerals.

In the example illustrated in FIG. 2, the first semiconductor chip 100 and the second semiconductor chip 200 have the same shapes as those shown in the example illustrated in FIG. 1A, and they are stacked on each other, being bonded together. Hereinafter, another example of a stacked semiconductor package will be described with reference to FIGS. 1A to 1C and FIG. 2. The stacked semiconductor package shown in the example illustrated in FIG. 2 is formed by stacking the second semiconductor chip 200 on the first semiconductor chip 100. The first semiconductor chip 100 may include a plurality of first pins 110-1, . . . , and 110-10 formed on one side for connection with an external circuit. The second semiconductor chip may include a plurality of second pins 210-1, . . . , and 210-10 formed on one side. Ends of the respective second pins 210 extend toward upper portions of the respective first pins 110 at a distance. That is, the second pins 210 may have been originally designed to have the same shape as the first pins 110, and then deformed to have the lower ends extending downward. Soldering in accordance with a prior art cannot provide reliable electrical connection between the ends of the second pins 210 and the upper portions of the first pins 110.

In a space between the second pins 210 and chip bodies 170 and 270, a PCB 300 is disposed above the first pins 110 along a length of the first and second semiconductor chips 100 and 200. The PCB 300 may include a plurality of conductive patterns 310-1, . . . , and 310-10 corresponding to the first and second pins 110 and 210. The conductive patterns 310-1, . . . , 310-8, and 310-10, excluding a short conductive pattern 310-9, are formed to extend from the ends of the second pins 210 toward the upper portions of the first pins 110. The conductive patterns 310-1, . . . , 310-8, and 310-10 and the ends of the corresponding second pins 210-1, . . . , 210-8, and 210-10 and the upper portions of the corresponding first pins 110-1, . . . , 110-8, and 110-10 are electrically connected by a bonding portion 500.

In the example illustrated in FIG. 2, the PCB 300 has a front surface similar to that of the PCB 300 shown in the example illustrated in FIG. 1C, and they are different from each other in that a rear surface of the PCB 300 of FIG. 2 has a similar pattern to the front surface. In the example illustrated in FIG. 2, the PCB 300 is an FPCB, but may be any other type of PCB. As shown in FIG. 2, each conductive pattern 310 of the PCB 300 includes a first conductive pattern 311 formed on a surface of the PCB 300 facing the chip bodies 170 and 270 and a second conductive pattern 313 formed on an opposite surface of the PCB 300 facing the second pins 210. A plurality of first conductive patterns 311 are formed at locations corresponding to the first pins 110. A plurality of second conductive patterns 313 are formed at locations corresponding to the respective second pins 210. Here, the conductive patterns which are formed at locations corresponding to the pins are arranged at the same intervals as the pins and have sizes which correspond to the sizes of the pins and are suitable to be bonded with the corresponding pins. The conductive patterns on the rear surface of the PCB 300 are formed in the same manner as the example illustrated in FIG. 1C, except for a short pattern related to a bridge pattern. However, the patterns on the rear surface do not need to reach the second pins 210, and thus it is acceptable for the patterns to be short patterns with a short length connected to the conductive patterns formed on the recess patterns 330. In addition, a conductive pattern on the rear surface which corresponds to the conductive pattern 330-9 connected to the CS pin 210-9 is removed.

Unlike the prior art, the end of the second pin 210 is not long enough to reach the upper portion of the first pin 110. Soldering in accordance with the prior art cannot provide reliable electrical connection between the end of the second pin 210 and the upper portion of the first pin 110. The conductive pattern 310 formed on the PCB 300 offers an extended plane that allows soldering paste to be stably connected between the end of the second pin 210 to be connected and the upper portion of the first pin 110.

In the example illustrated in FIG. 2, the bonding portion 500 may be formed by soldering the first and second pins 110 and 210 to the conductive pattern 310. In the course of passing through soldering paste solution, soldering solution is adhered to cover the upper portion of the first pin 110, passing through the conductive pattern 310 from the ends of the second pins 210, and thereby providing stable electrical connection between the first and second pins 110 and 210.

Although the above mentioned U.S. Pat. No. 6,242,285 discloses a method of connecting pins using an auxiliary unit similar to a PCB, the PCB of the prior art only provides a path for bridging between a control pin on an upper chip and an NC pin on a lower chip. A configuration for bridging is not particularly disclosed in the prior art. In the prior art, the pins on the upper and lower chips are directly connected primarily by soldering.

In the example illustrated in FIG. 2, the PCB 300 is an FPCB, but may be any other type of PCB. The conductive pattern 310 of the PCB 300 includes the first conductive pattern 311 formed on the surface of the PCB 300 facing the chip bodies 170 and 270 and the second conductive pattern 313 formed on an opposite surface of the PCB 300 facing the second pins 210. A plurality of first conductive patterns 311 are formed at locations corresponding to the first pins 110. A plurality of second conductive patterns 313 are formed at locations corresponding to the respective second pins 210. Here, the conductive patterns which are formed at locations corresponding to the pins are arranged at the same intervals as the pins and have sizes which correspond to the sizes of the pins and are suitable to be bonded with the corresponding pins.

As shown in the example illustrated in FIG. 2, the bonding portion 500 may include a first bonding portion 510 which connects the first conductive pattern 311 and the corresponding first pin 110 on the first semiconductor chip 100 and a second bonding portion 520 which connects the second conductive pattern 313, the corresponding second pin 210 extending from the second semiconductor chip 200 toward the upper portion of the first pin 100, and the upper portion of the first pin 100. In comparison with the example illustrated in FIG. 1D, the first bonding portion 510 is further provided, and thus more reliable electrical connection between the first and second pins 110 and 120 can be achieved. As will be described later, while passing through the soldering paste solution, soldering solution is fixed and bonded to the conductive pattern 310.

According to another aspect, the PCB 300 may further include recess patterns 330 formed above the upper portion of the first pins 110 and in alignment with the first pins 110 and/or the second pins 210. The recess patterns 330 may be in contact with the upper portions of the respective first pins 110, and accordingly the PCB 300 can be disposed in alignment with the first and second pins 110 and 210 of the first and second semiconductor chips 100 and 200.

Each of the recess patterns 330 may be formed by cutting a conductive through-hole along a length direction, wherein the conductive through-hole electrically connects a first conductive pattern 110 and a second conductive pattern 210 at a corresponding position. In this case, since a recess on a cut portion of each recess pattern 330 has a conductive pattern formed thereon, as shown in the example illustrated in FIG. 2, the soldering paste permeates deep into the recess, thereby fastening the connection with the first and second pins 110 and 210. However, like in the example illustrated in FIG. 1C, the recess pattern 330-9 corresponding to the short conductive pattern 310-9 is a chamfer pattern that does not include the conductive pattern. However, the recess patterns are not limited to the above, and all recess patterns may be simple chamfer patterns without having conductive patterns formed thereon.

According to another aspect, the PCB 300 may further include the bridge pattern 350 that has one end connected to a control pin of the second semiconductor chip 200 and the other end connected to the NC pin of the first semiconductor chip 100. The bridge pattern 350 may be formed on the inner layer to be electrically disconnected from the conductive patterns 310. That is, the PCB 300 in the example illustrated in FIG. 2 is a multi-layer FPCB.

The illustrated examples are disclosed under the assumption that two identical DRAM packages are stacked to double the capacity of memory. However, the described examples are only exemplary, and are not intended to limit the scope of the present invention. In the examples, most pins such as address pins and data pins on the respective upper and lower chips are connected to the respective corresponding pins. To double the capacity, addresses should be substantially extended by use of a CS pin 210-9 which distinguishes the chips from each other during read and write operations. To this end, the NC pin 110-7 on the first semiconductor chip 110 which is a lower chip is used.

As shown in the example illustrated in FIG. 1C, the bridge pattern 350 may include one end connected to the short conductive pattern 310-9 via the through hole 351-2 and the other end connected to one 330-7 of conductive patterns via a through hole 351-1, and be configured as an inner pattern 353 formed on the inner layer of the multi-layer. The conductive pattern 310-9 is formed to be short enough, and the second pin 210-9 which is bonded to the short conductive pattern 310-9 is cut substantially short. Hence, in the course of passing through soldering paste solution, the soldering solution covers the first pin 110-9 corresponding to the second pin 210-9, so that direct electrical connection between the first pin 110-9 and the second pin 210-9 can be avoided. Accordingly, the CS pin 210-9 on the second semiconductor chip 200 can be electrically connected to the NC pin 110-7 on the first semiconductor chip 100, and hence the second semiconductor chip 200 can be directly controlled through the NC pin 110-7 on the first semiconductor chip 100 when the first pins 110 on the first semiconductor chip 100 are connected to an external mount board.

Figure 3:
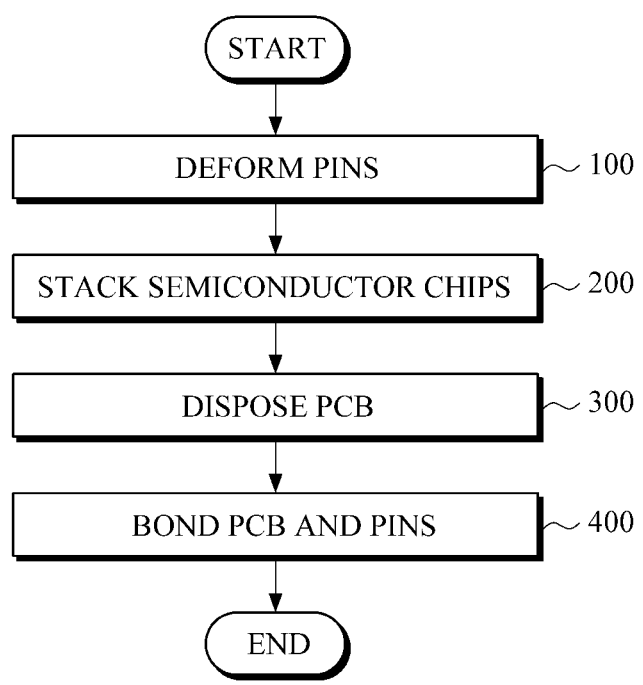
FIG. 3 illustrates a flowchart of an example of the method of stacking semiconductor chips.

Hereinafter, an example of a method of stacking semiconductor chips will be described with reference to FIG. 3. FIG. 3 illustrates a flowchart of an example of the method of stacking semiconductor chips. Pins of the semiconductor chips are deformed to extend downward (100). If the pins of the semiconductor chips extend horizontally as the first pins 110 of the first semiconductor chip 100 in FIG. 1A, the pins are pressed using a press mold such that ends of all pins extend downwards. The press mold is formed of a pair of upper and lower molds. When a chip placed on the lower mold is pressed by the upper mold, the ends of the pins are deformed to be directed downwards. In this case, the control pin 210-9 may be processed in advance by a different press mold to be cut shorter than the other second pins.

Thereafter, the semiconductor chip having the deformed pins is stacked on another semiconductor chip (S200). Referring to FIG. 1A or 2 again, after an adhesive material such as epoxy is applied on a top surface of the chip body 170 of the first semiconductor chip 100, the second semiconductor chip 200 is pressed upon the first semiconductor chip 100 and heat is applied to harden the epoxy, and thereby the two semiconductor chips 100 and 200 are stacked together. During stacking operation, a jig may be used to accurately align the first and second semiconductor chips 100 and 200.

Then, in a space between the pins of the stacked semiconductor chips and the exterior of unit chip packages, a PCB including a plurality of conductive patterns which correspond to at least some pins is disposed in alignment with the pins (300). As shown in the example illustrated in FIG. 1A or 2, to accurately and precisely insert the multi-layer FPCB into such a narrow space, a microscope may be used to magnify the space. In this case, the PCB may include recess patterns arranged on upper portions of the pins on the lower semiconductor chip.

The conductive patterns, the pins on the upper semiconductor chip, and the pins on the lower semiconductor chip are electrically connected by bonding (400). To remove impurities from a portion to be bonded, the stacked semiconductor chip packages pass through flux. Subsequently, the stacked semiconductor chip packages pass through a container which is filled with boiling soldering paste solution up to a constant height, while sinking into the soldering paste solution. The depth for the stacked semiconductor chip packages to sink may be deliberately set to remain at a level that is slightly above the bonding portion between the first pins and the second pins. That is, the soldering paste solution is provided up to a level that is higher than a bonding surface between the upper and lower chips and is lower than a portion of the upper chip from which the pins protrude. Then, the soldering paste solution is cooled to be hardened, and then passes through a cleaning room to remove residual flux.

A final package after the stacking operation undergoes tests, and then is packed in a tray for transport.

As described above, when an upper semiconductor chip and a lower semiconductor chip which are spaced apart such that upper and lower pins of the respective upper and lower semiconductor chips cannot be directly bonded together are stacked on each other, a PCB including a plurality of conductive patterns is arranged near the upper and lower pins, thereby allowing reliable bonding between the upper and lower pins. Recess patterns formed on one side of the PCB to have the same pitch as the pins are placed above upper portions of the lower pins, thereby facilitating the alignment of the PCB.

The current embodiments can be implemented as computer readable codes in a computer readable record medium. Codes and code segments constituting the computer program can be easily inferred by a skilled computer programmer in the art. The computer readable record medium includes all types of record media in which computer readable data are stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable is record medium may be distributed to computer systems over a network, in which computer readable codes may be stored and executed in a distributed manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of stacking a semiconductor chip, the method comprising:
    deforming pins of a first semiconductor chip such that ends of the respective pins extend downward;
    stacking and bonding the first semiconductor chip having the deformed pins onto a second semiconductor chip;
    disposing a printed circuit board (PCB) in a space between the deformed pins of the first semiconductor chip and bodies of the stacked first and second semiconductor chips, the PCB comprising a plurality of conductive patterns corresponding to at least some pins of the stacked first and second semiconductor chips; and
    electrically connecting the respective conductive patterns and respective corresponding pins of the first semiconductor chip and the second semiconductor chip.

2. The method of claim 1, wherein the disposing of the PCB comprises disposing the PCB such that recess patterns formed on one side of the PCB are arranged above the pins of the second semiconductor chip.

3. The method of claim 1, wherein the electrical connecting of the conductive patterns and the pins comprises passing the stacked first and second semiconductor chips through soldering paste solution which is provided up to a level that is higher than a bonding surface between the first and second semiconductor chips and is lower than a portion of the first semiconductor chip from which the pins protrude.

* * * * *